United States Patent [19]

Phillips et al.

[11] 4,051,695
[45] Oct. 4, 1977

[54] ROTATING SHAFT COUPLING FOR USE IN VACUUM

[75] Inventors: Wayne E. Phillips, Boulder, Colo.; Glen R. Scheuermann, Hollywood, Calif.

[73] Assignee: Airco, Inc., Montvale, N.J.

[21] Appl. No.: 680,542

[22] Filed: Apr. 27, 1976

[51] Int. Cl.² ............................................. F16D 3/02
[52] U.S. Cl. .............................................. 64/8; 64/7; 403/121
[58] Field of Search ................... 64/8, 7, 21; 403/121

[56] References Cited

U.S. PATENT DOCUMENTS

| | | | |
|---|---|---|---|
| 2,760,358 | 8/1956 | Helm et al. | 64/7 |
| 2,780,080 | 2/1957 | Cork | 64/8 |
| 3,940,946 | 3/1976 | Anderson | 64/8 |
| 3,955,378 | 5/1976 | Allonca | 64/7 |

FOREIGN PATENT DOCUMENTS 624,166  2/1959  Italy ........................................... 64/8

Primary Examiner—Samuel Scott
Assistant Examiner—Randall Heald
Attorney, Agent, or Firm—David A. Draegert; Edmund W. Bopp

[57] ABSTRACT

A coupling for use between two rotating shafts in a high-temperature, high-vacuum environment is described. The coupling includes a socket having two closed loop, axially spaced, interior bearing surfaces and a roller having two closed loop, axially spaced, exterior bearing surfaces for rolling contact with the interior bearing surfaces of the socket. The interior and exterior bearing surfaces make rolling contact at two radially opposed and axially spaced locations, and the second shaft is disposed at a desired angle with respect to the first shaft. Means are provided for preventing disengagement of the roller and shaft as they rotate. In a preferred embodiment, the angle between the shafts is constant as they rotate and the roller is sized so that it is easily removed from the socket when the axes of the shafts are approximately aligned. The coupling of this invention enables a substrate to be rotated while supported at a desired angle to a coating vapor source and a substrate heater inside an evacuated chamber.

13 Claims, 2 Drawing Figures

ROTATING SHAFT COUPLING FOR USE IN VACUUM

BACKGROUND OF THE INVENTION

1. Field of the Invention

The invention is in the field of coating apparatus for use in coating by vaporized material in a vacuum chamber.

2. Description of the Prior Art

In vacuum coating processes, it is sometimes desirable to hold the substrate to be coated at an angle with respect to the source of coating vapor. Further, proper coating of the substrate may require that it be continuously rotated about a particular axis. When the substrate is a turbine engine part which is to be coated with a special alloy which is resistant to corrosion at high temperatures, the coating process involves substrate temperatures exceeding 800 C and pressures of less than $10^{-2}$ Torr. Frequently, the coating process requires 1100 C and $10^{-5}$ Torr. All equipment within the coating chamber must then be able to withstand these extremes of temperature and pressure and must not contain cavities, lubricants, or other sources of vapor which might contaminte the coating. Additionally, the equipment must operate reliably without being affected by the deposition of coating material.

In the prior art, turbine engine parts have been dangled from the end of a rotatable shaft by a conventional U-joint in which one shaft is pinned between a U-shaped fixture at the end of a second shaft. One problem has been that the mechnical limit on the angle between the shafts of a conventional U-type joint is not constant in all rotational positions of the shafts. Thus, if a part is allowed to dangle to the angular limit of the U-type joint, rotation of one shaft about a fixed horizontal axis causes the part to bob up and down as it rotates. Conventional U-type joints have also not been able to withstand the adverse conditions of the coating process. Despite the use of shields, the excessive heat and the deposition of coating material have caused prior art U-type joints to stiffen or freeze after only a few coating cycles, causing defective coating of the turbine part being processed at the time of the failure. Alternately, the joint pin may loosen and fall out allowing the part to fall into the coating source. The present invention is the culmination of a specific attempt to overcome these and other problems in the prior art.

SUMMARY OF THE INVENTION

The invention is a coupling suitable for use between two rotatable shafts in a high-temperature and high-vacuum environment. The coupling comprises a socket affixable to the end of the first shaft, a roller affixable to an end of the second shaft, and a means for preventing disengagement of the socket and roller. The socket has two closed loop, axially spaced, interior bearing surfaces. The roller is sized to fit inside the socket and also has two closed loop, axially spaced, exterior bearing surfaces for making rolling contact with the two interior bearing surfaces of the socket. The rolling contact occurs at two radially opposed and axially spaced locations. At each of these locations, the radial distance from each exterior bearing surface to the axis of the second shaft is shorter than the distance from the interior bearing surface to the axis of the first shaft. Thus, the second shaft is disposed at an angle to the first shaft.

The closed loop of each bearing surface may be elliptical, circular, or otherwise as desired. The various bearing surfaces may be cylindrical, conical or irregular with respect to an axis of the socket or roller. Further, the bearing surfaces may be provided with gear teeth or other means to provide more positive means for engagement between the socket and roller. All these variations are considered to be within the scope of the phrase "closed loop bearing surface". Because a specific configuration of a bearing surface may not have a single or constant radius, the term "radial distance" is intended to refer to the average radius of the surface at a particular location.

Preferably, there is at least one rotational position in which the exterior radial distance of all parts of the roller is smaller than the interior radial distance of all sections of the opening of the socket. Thus, the roller may be inserted or removed from the socket when the first and second shafts are approximately aligned along the same axis.

In a preferred embodiment, each interior bearing surface is a smooth, circular cylinder concentric with the axis of the first shaft, and each exterior bearing surface is a smooth cone which is circularly symetric about the axis of the second shaft. In this preferred embodiment, the constant radii of the interior bearing surfaces are equal and each is greater than the radius of the exterior bearing surfaces at the location where the corresponding interior and exterior bearing surfaces are in contact. Assuming adequate frictional coupling between socket and roller, rotation of either shaft will cause the other to rotate while the angle between the axes of the shafts remains at a constant predetermined valve.

The coupling is made from materials suitable for use in high vacuum and at high temperatures without galling or softening. In one particular application, the coupling is supported at the end of a first shaft and a substrate or a substrate adapter is attached to the second shaft. This assembly is placed inside a vacuum chamber where the coupling allows the substrate to hang by its own weight at a desired angle in the vicinity of a coating source and a substrate heater. The first shaft is connected to a rotational drive means and the substrate is rotated at a desired rate while it is heated and coated. A shield between the bearing surfaces and the coating source is provided for preventing interference in the operation of the coupling resulting from a buildup of deposited material. The shield is also helpful in preventing warping of the bearing surfaces caused by overheating.

DETAILED DESCRIPTION OF A PREFERRED EMBODIMENT

Figure 2:
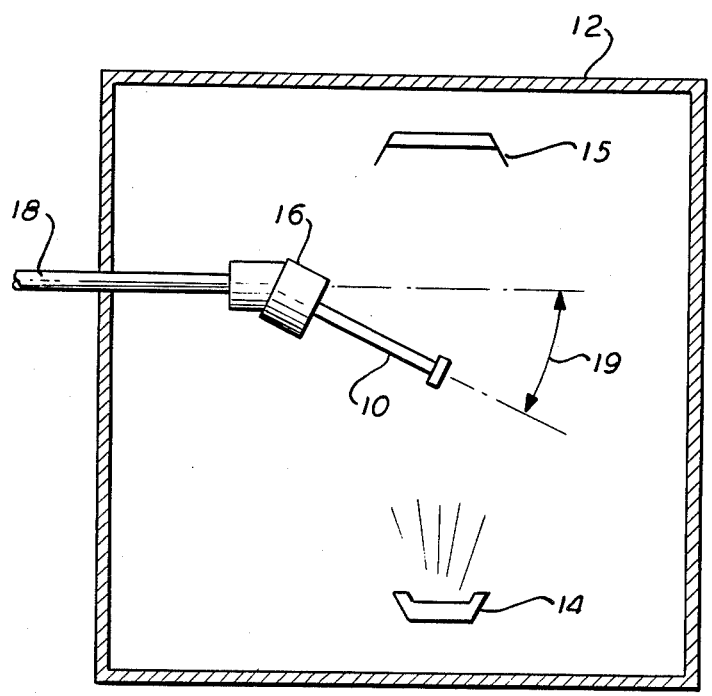
FIG. 2 is a schematic illustration of a particular use of the present invention in a vacuum coating process.

FIG. 2 shows a part 10, such as a turbine blade or vane, which is to be coated, a coating source 14, and a substrate heater 15 positioned inside an evacuable chamber 12. Coating source 14 and substrate heater 15 are conventional, such as an electronbeam heated, rod-fed crucible, and a radiant emitter, respectively. In order to obtain the desired coating thickness distribution, it is desirable to suspend part 10 at an angle 19 above the coating source and to rotate the part about its individual axis. Part 10 is fixed to one end of shaft coupling 16. The other end of coupling 16 is attached to an end of a first shaft 18 which may extend to a rotating drive means (not shown) located outside chamber 12.

Figure 1:
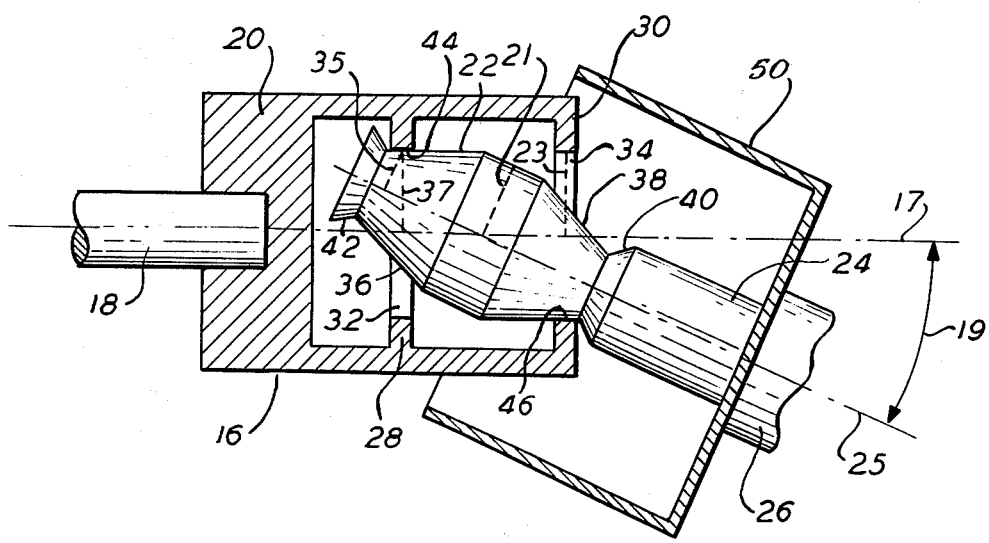
FIG. 1 is a sectional view of a preferred embodiment of the present invention illustrating the socket and roller with the first and second shafts positioned at an angle.

Coupling 16 is shown in a preferred form in FIG. 1. An end of first shaft 18 is affixed to a socket 20 and a roller 22 is affixed to an end of a second shaft 24. The second shaft is affixed to a part adapter 26 or directly to the part 10, as desired. Shield 19 is attached to the second shaft 24 and is shaped to generally enclose the opening of the socket 20, and prevent coating material from depositing on the bearing surfaces.

Socket 20 has two inwardly extending flanges 28 and 30 spaced along the axis 17 of the first shaft 18. Each of flanges 28 and 30 has an interior bearing surface 32 and 34, respectively, which forms a closed loop about axis 17. In the illustrated embodiment, surfaces 32 and 34 are smooth, circular-cylindrical faces coaxial with the horizontal axis 17 of the first shaft 18.

Roller 22 has two closed loop, exterior bearing surfaces 36 and 38 spaced along the axis 25 of the second shaft 24. As illustrated in FIG. 1, the surfaces 36 and 38 are smooth, conical faces, tapered in opposite directions and circularly symetric about axis 25 of second shaft 24. Exterior bearing surface 36 contacts interior bearing surface 32 at a location 44 at the highest point of surface 32. The taper of exterior bearing surface 36 is such that its radius decreases along axis 25 in the direction away from the end of second shaft 24. However, the radial distance from axis 25 of second shaft 24 to the surface 36 has an average value 35 at location 44. The radial distance 35 is less than the radial distance 37 from axis 17 of first shaft 18 to the interior bearing surface 32 at the location 44 where surfaces 36 and 32 are in contact. The angle of taper of surface 36 is such that the interior and exterior bearing surfaces are tangential at location 33 where they are in contact. Similarly, exterior bearing surface 38 is in tangential contact with interior bearing surface 34 at a location 46 at the lowest point of surface 34. As a result, axis 25 of second shaft 24 makes an angle 19 with axis 17 of first shaft 18.

When first shaft 18 and socket 20 are rotated about their axis 17, the corresponding bearing surfaces 32 and 36, and 34 and 38 remain in rolling contact, and roller 22 and second shaft 24 are rotated about their axis 25. The angle 19 is constant in all rotational positions.

Roller guiding means are provided for preventing disengagement of the bearing surfaces of the roller and socket as they rotate. In the preferred embodiment, roller 22 has a shoulder 42 which tapers in the opposite direction from bearing surface 36 and which is positioned to extend behind flange 28 of socket 20. Similarly, roller 22 has a shoulder 40 which tapers in the opposite direction from bearing surface 38 and which is positioned to extend in front of flange 30 of socket 20.

Roller 22 has a maximum exterior radius 21 which is smaller than the minimum interior radius 23 of the circular opening of the socket. Thus, when the first shaft and second shaft are approximately aligned so that their axes coincide, roller 22 may be removed or inserted through the opening in the socket 20.

When first shaft 18 is supported for rotation about its axis 17, the preferred coupling 16 allows second shaft 24 and any attached part 10 to hang at a constant, predetermined angle 19 with respect to axis 17. As first shaft 18 is rotated, the friction between the two internal bearing surfaces 32 and 34 of socket 20 and two exterior bearing surfaces 36 and 38 of roller 22 cause second shaft 24 to rotate about its axis 25. Roller 20 is guided by shoulders 42 and 40 which engage flanges 28 and 30, respectively, and prevent disengagement of roller 22 and the socket 20 as they rotate. The deposition of coating material on the bearing surfaces is prevented by shield 50.

The bearing surfaces of the socket and roller must be of a material which will withstand the operating pressures and temperatures without warping or seizing. The roller and socket may be 316 stainless steel, but HASTELLOY B alloy is preferred because it better maintains its strength at temperatures exceeding 800 C. It is preferred that the bearing surfaces be tangential at the locations where they are in contact in order that the force be spread over a finite area rather than being concentrated at a point.

As illustrated, interior bearing surfaces 32 and 34 are parallel to axis 17 and exterior bearing surfaces 36 and 38 taper in opposite directions along axis 25. Neither of these conditions is necessary but both are preferred because the angle of taper of each exterior bearing surface from axis 25 is then the same as angle 19 between axes 17 and 25. The proper roller for a particular part is then easily identified from among a selection made with different tapers in order to obtain the desired coating distribution on different types of parts. The same socket 20 can be used for receiving all of the rollers.

Preferably, a quick disconnect means (not shown) is provided for attaching part 10 or part adapter 26 to second shaft 24. Socket 20 may be fixed to the end of first shaft 18 by more permanent means.

Numerous variations, alternative embodiments, and other uses of the present invention will be apparent to those skilled in the art of vacuum coating equipment and processes.

What is claimed is:

1. A coupling between first and second rotatable shafts for use in vacuum vapor coating apparatus comprising:
    a. a socket affixable to an end of the first shaft, the socket having an opening and two closed loop, axially spaced, interior bearing surfaces;
    b. a roller inside the socket and affixable to an end of the second shaft, the roller having two closed loop, axially spaced, exterior bearing surfaces for making rolling contact with the interior bearing surfaces of the socket at two radially opposed and axially spaced locations at which the radial distance from each exterior bearing surface to the axis of the second shaft is shorter than the radial distance from the contacting interior bearing surface to the axis of the first shaft, whereby the second shaft is disposed at an angle to the first shaft; and
    c. means for preventing disengagement of the socket and the roller when their bearing surfaces are in rolling contact.

2. The coupling of claim 1 further comprising means for shielding the interior and exterior bearing surfaces from coating vapor.

3. The coupling of claim 1 wherein each interior bearing surface is circularly symmetric about the axis of the first shaft and each exterior bearing surface is circularly symmetric about the axis of the second shaft, whereby the second shaft is disposed at a constant predetermined angle to the first shaft.

4. The coupling of claim 3 wherein the maximum exterior radial distance of the roller is less than the minimum internal radial distance of the socket opening and the roller is removable from the socket.

5. The coupling of claim 4 wherein the socket comprises an inwardly extending first flange.

6. The coupling of claim 5 wherein the disengagement prevention means comprises a shoulder on the roller positioned for engagement with the first flange of the socket.

7. The coupling of claim 6 further comprising means for shielding the interior and exterior bearing surfaces from a coating source.

8. The coupling of claim 7 wherein the socket further comprises an inwardly extending second flange and the two interior bearing surfaces are smooth faces of the first flange and the second flange.

9. The coupling of claim 8 wherein the two exterior bearing surfaces are tapered.

10. The coupling of claim 9 wherein the smooth face of each flange is cylindrical and the angle of each taper is such that the interior and exterior bearing surfaces are tangential at the locations where they are in contact.

11. The coupling of claim 10 wherein the socket and the roller are made from materials which maintain their strength above 800 C.

12. An improved apparatus for coating a turbine engine part with a high temperature corrosion-resistant alloy, the apparatus of the type including an electron-beam heated vapor source, a part heater, and an end of a shaft rotatable about an axis all located inside an evacuable chamber, wherein the improvement comprises:
   a socket fixed to the end of the shaft, the socket having an opening and two closed loop, axially spaced, interior bearing surfaces;
   a roller fixed to the part, the roller having an axis and two closed loop, axially spaced, exterior bearing surfaces for making rolling contact with the interior bearing surfaces of the socket at two radially opposed and axially spaced locations at which the radial distance from each exterior bearing surface to the axis of the roller is shorter than the radial distance from the contacting interior bearing surface to the axis of the first shaft, and the maximum exterior radial distance of the roller is less than the minimum interior radial distance of the interior opening of the socket;
   means for preventing disengagement of the socket and the roller when the bearing surfaces are in contact; and
   means for shielding the interior and exterior bearing surfaces from the vapor source.

13. The improved apparatus according to claim 12, wherein
   the interior bearing surfaces are circularly symetric and coaxial with the shaft; and
   the exterior bearing surfaces are circularly symetric, tapered, and coaxial with the roller.

* * * * *